United States Patent [19]
Vosburgh

[11] 3,802,065

[45] Apr. 9, 1974

[54] METHOD AND STRUCTURE FOR MOUNTING SEMICONDUCTOR CHIPS

[75] Inventor: Lloyd E. Vosburgh, Stamford, Vt.

[73] Assignee: General Electric Company

[22] Filed: Mar. 16, 1972

[21] Appl. No.: 235,148

[52] U.S. Cl. .......................... 29/574, 29/589, 29/591

[51] Int. Cl. .......................... B01j 17/00

[58] Field of Search .......... 29/574, 589, 591, 576 S, 29/588; 317/234 M

[56] References Cited

UNITED STATES PATENTS

| | | | |
|---|---|---|---|
| 3,160,798 | 12/1964 | Lootens et al. | 317/234 A |
| 3,281,628 | 10/1966 | Bauer et al. | 29/576 S |
| 3,549,732 | 12/1970 | Reifel | 29/588 |
| 3,031,747 | 5/1962 | Green | 29/473.1 |
| 3,387,359 | 6/1968 | Dale | 29/577 |
| 3,461,462 | 8/1969 | Ruggiero | 29/590 |
| 3,484,933 | 12/1969 | Hagan | 29/577 |

*Primary Examiner*—W. C. Tupman

[57] ABSTRACT

Individual semiconductor chips are bonded to each of a plurality of tabs etched in a base component. The chips may be attached to the tabs at a temperature suitable for forming a eutectic gold-semiconductor bond. Each chip is supported by a single tab. In this configuration, the chips may be tested, cleaned, and inspected as a group. The resultant chip and tab subassemblies may be individually removed from the batch handling configuration and then attached in a circuit through a low temperature attachment process.

5 Claims, 6 Drawing Figures

METHOD AND STRUCTURE FOR MOUNTING SEMICONDUCTOR CHIPS

The present invention relates to an improved method for attachment of semiconductor devices, and more particularly to the bonding of semiconductor chips to mounting tabs.

BACKGROUND OF THE INVENTION

With presently known techniques, production, testing and mounting of semiconductor chips are made difficult because these chips are of small size and difficult to handle. Handling of such chips in the past generally has required mounting and connection forming techniques for individual devices, incorporating the chips, accomplished in one-at-a-time fashion. Thus, a great deal of labor has been required in preparing individual devices incorporating the chips. Such labor has added greatly to the manufacturing cost of the mounted chips as well as to assemblies utilizing the chips, as for example, hybrid circuits.

Further, attachment problems were encountered in the prior art when mounting chips individually in hybrid circuits. Prior art attachment techniques invariably required the heating of the chip/hybrid circuit assemblies to an elevated temperature to effect the necessary attachment or bond. These elevated temperatures have a detrimental effect on substrate resistors and other components employed in hybrid circuit manufacture.

The present invention permits a lower temperature attachment of the chips, for example, by soldering, to eliminate failures due to high temperatures required by the prior art.

OBJECTS

Accordingly, it is an object of the present invention to reduce the cost and difficulties encountered by past testing and mounting methods for semiconductor devices, of the nature contemplated herein, by providing an improved, economical method for the handling of such semiconductor devices in a batch.

It is another object of the invention to provide an improved method for bonding individual chips to a plurality of tabs arranged in an array for easing problems in batch handling.

It is a further object of the invention to provide an improved structure for semiconductor devices to easily permit the attachment of semiconductor chips in circuits.

It is another object of this invention to provide an improved bond between a semiconductor chip and a tab or connecting element for attaching the chip.

Additional objects and advantages of this proposed method of attaching semiconductor devices as well as the fabricated semiconductor devices will be made apparent by the following detailed discussion.

SUMMARY OF THE INVENTION

In accordance with the invention, individual chips utilized in semiconductor devices are mounted upon and bonded to one of a plurality of tabs previously etched in a base component of a suitable material having thermal expansion characteristics compatible to those of the chip material. This forms a frame member with tabs attached thereto. The individual chips are attached to a gold-plated surface of the tabs by heating the mounted chips and the tabs to a temperature sufficient to form a eutectic bond between the chip material and the gold plate. In this configuration, the chips may be tested, cleaned, and inspected as a group before removal of the semiconductor device and its mounting tab from the strip. The resultant chip and tab subassembly may be individually removed from the batch handling frame and then attached in a circuit at less than 200°C through a low temperature attachment process, thus avoiding damage to other components of the circuit.

BRIEF DESCRIPTION OF THE DRAWINGS

An understanding of the invention may be had from the following description when taken with the drawings wherein.

DESCRIPTION OF PREFERRED EMBODIMENTS

Figure 1:
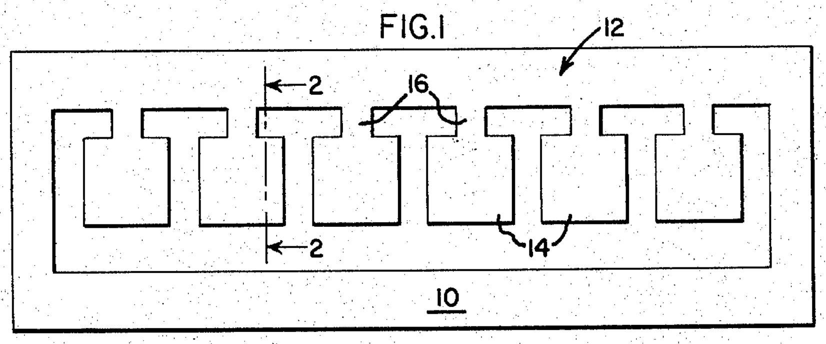
FIG. 1 is a top view of a base component with tabs formed therewith.
Figure 2:
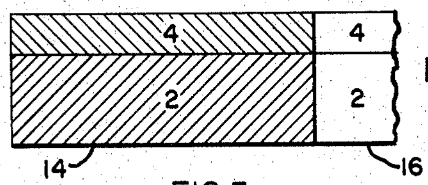
FIG. 2 is a sectional view taken along the line 2—2 in FIG. 1.

Referring now more particularly to FIG. 1, a strip 10 of suitable configuration for batch handling of semiconductor chips is formed from a gold-plated base component 10 which specifically includes a base material 2 and a gold layer 4 plated thereon as illustrated more clearly in FIG. 2. The base component is chemically etched to provide a plurality of tab members 14 connected to a frame 12 by neck portions 16.

Figure 3:
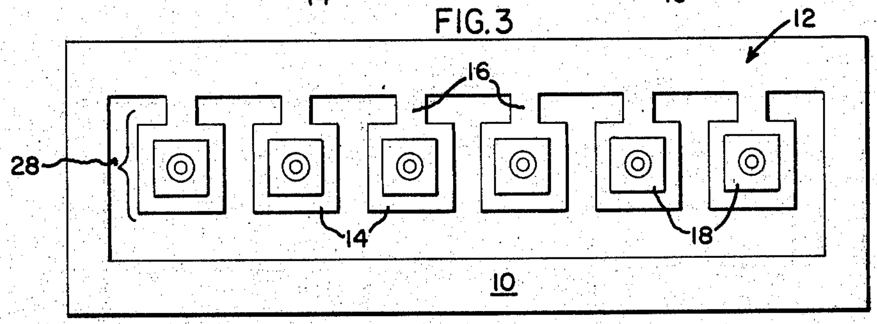
FIG. 3 is a top view of a base component with chips bonded thereto.

Once the frame member 12 with the attached tab members 14 has been formed, each of the tab members 14 has an individual semiconductor chip 18 mounted on its gold-plated surface to form as assembly, as in shown in FIG. 3, which lends itself to batch processing and treatment of the chips.

This assembly of tab members and associated chips placed thereon is heated to a temperature sufficiently high to form a eutectic bond between the semiconductor material of the chips and the gold layer on the tab members. Since a high temperature bond is being effected between the gold layer on the base material and the chosen semiconductor material on the chips, certain properties of the base material of the tab must obtain for a successful bond. One important requirement in selecting such a base material is that the coefficient of thermal expansion of the base material must be compatible to the thermal expansion characteristics of the semiconductor material of the chips. Another consideration in choosing the base material is that the base material must have sufficient thermal conductivity to enable adequate cooling of the semiconductor chips during their operation in an electric circuit. For silicon chips, it is found that an alloy comprising Ni, Fe, Co, sold under the trade name Kovar, molybdenum, or any of a number of alloys satisfying the above criteria are suitable base materials for the gold-plated tabs. If, for example, Kovar is used as the base material with silicon chips, a temperature in slight excess of 400°C is necessary to effect the aforementioned gold-silicon eutectic bond. On the other hand, if germanium chips are used and the suitable base material is Kovar, a temperature of 390°C is necessary to form a eutectic bond between the gold layer and the germanium chip.

Figure 4:
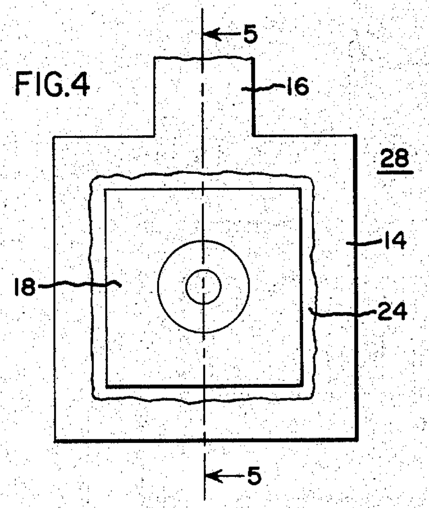
FIG. 4 shows a top view of a single tab with a chip bonded thereto.
Figure 5:
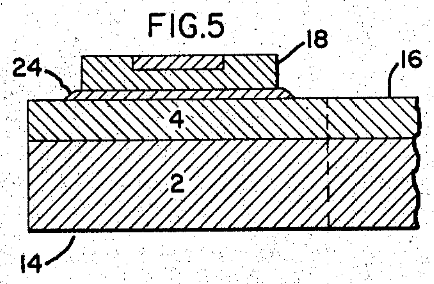
FIG. 5 is a sectional view taken along the line 5—5 in FIG. 4.

FIGS. 4 and 5 show detailed views of chips 18 bonded eutectically to the gold layer 4 on the tabs 14 to form subassemblies 28. These figures show chips 18 with an eutectic bond region 24 between the semiconductive material of chips 18 and the gold layer 4 on the tab.

After the bonding operation has been completed, the assembly facilitates batch testing of the chips for their electrical characteristics, physical inspection for flaws under a microscope, or cleaning of the chips in a group while the subassemblies 28 remain attached to frame 12.

Figure 6:
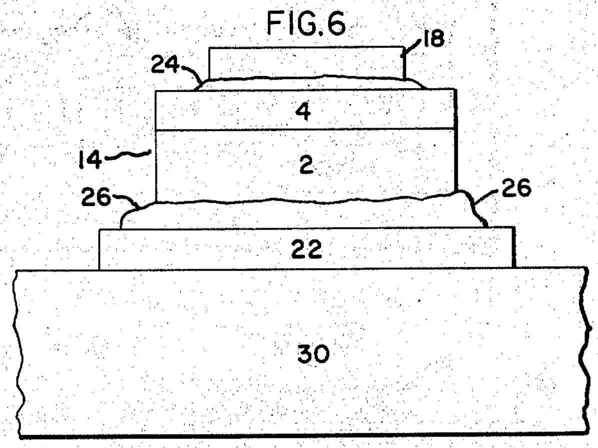
FIG. 6 shows a chip bonded to its tab and mounted in a hybrid circuit by soldering.

After inspection and testing, the individually formed subassemblies 28 are removed from the frame 12 by severing them from the frame at the neck portions 16. Individual subassemblies thus separated may be subsequently attached to a mounting pad 22 in, for example, a hybrid circuit having a substrate 30, as shown in FIG. 6. Using a tab member 14 as a chip support or chip connecting element allows the attachment of the subassemblies 28 into a circuit by means of a soft soldering process. A solder connection is shown as layer 26. These subassemblies may be attached to the mounting pads at temperatures substantially less than the eutectic bond temperatures and the soldering temperatures are almost always below 200°C. Such low temperatures allow bonding of semiconductor chips in circuit applications without adversely affecting resistors or other components also attached to the substrate 30 of the hybrid circuit. Former high temperature bonding techniques adversely affected devices attached to substrate 30 whereas the low attachment temperatures used in, for example, soldering, do not cause detrimental effects in such devices. The lower temperature attachment technique of this invention, facilitated by the use of tab bonding of chips as described above, results in fewer substrate-attached device failures in circuitry utilizing individually mounted semiconductor chips.

What is claimed as new and to be secured by Letters Patent of the United States is:

1. A method of mounting on mounting pads those fabricated electronic devices having a semiconductor base substance comprising the steps of:

a. forming from a piece of base material a plurality of tab members each connected to a common frame member by a neck portion, said base material having thermal expansion properties compatible with the thermal expansion properties of the semiconductor base substance of said devices, said base material being coated with a surface layer of a metallic substance, said metallic substance and said semiconductor base being characterized by their being fusible together at a eutectic temperature which is lower than a temperature which will damage said devices;

b. heating said interconnected frame member, tab members, and necks to a temperature slightly higher than said eutectic temperature;

c. placing an individual electronic device having a semiconductor base material face up on each of a plurality of said coated tab members of said heated frame member to effect a eutectic bond between said semiconductor base material and said metallic substance to form a plurality of electronic subassemblies;

d. testing said subassemblies and removing any deficient subassemblies;

e. removing said tested subassemblies from said frame member; and f. attaching said subassemblies to said mounting pads at temperatures substantially less than said eutectic temperature whereby said devices are mounted on said pads with a minimum heat damage to said devices and to other proximate electronic components.

2. A method according to claim 1 wherein the temperature to which the frame member is heated is approximately 400°C and the temperature for attaching said subassemblies to said moutnting pads is less than 200°C and wherein said metallic substance contains gold, said base material is an alloy comprising Ni, Fe, and Co, and said semiconductor base substance is silicon.

3. A method according to claim 1 wherein the temperature to which the frame member is heated is approximately 400°C, the temperature for attaching said subassemblies to said mounting pads is less than 200°C and wherein said metallic substance contains gold, said base material is molybdenum and said semiconductor base substance is silicon.

4. A method according to claim 1 wherein the temperature to which the frame member is heated is approximately 390°C, the temperature for attaching said subassemblies to said mounting pads is less than 200°C, and wherein said metallic substance contains gold, said base material is an alloy consisting of Fe, Ni, Co, and said semiconductor base substance is germanium.

5. A low temperature method of mounting operational electronic semiconductor devices on mounting pads on a substrate board with a minimum casualty loss of such devices and with minimum damage to ther electronic components mounted on said substrate board comprising the steps of:

a. forming a unitary frame, tab members and neck portions interconnecting said tab members and frame of an electrically conducting material having a thermal coefficient of expansion compatible with the thermal expansion of silicon, said material having a layer of gold plated on one surface;

b. heating said frame, tab members and neck portions to temperature slightly above the eutectic temperature for silicon-gold;

c. placing an individual silicon base operational electronic semiconductor device face up on the gold plated surface of each of a plurality of said tab members to effect a eutectic bond between said device and tab member to cause each said tab on which a device is mounted to form a subassembly;

d. cooling and retaining said frame member and attached subassemblies at a temperature less than said eutectic temperature;

e. testing said subassemblies and removing those subassemblies which are inadequate;

f. removing a tested subassembly from said frame;

g. attaching said tested subassembly removed from said frame to said pad by soft soldering at a temperature not to exceed 200°C.

* * * * *